United States Patent [19]
Lane et al.

[11] Patent Number: 5,592,102
[45] Date of Patent: Jan. 7, 1997

[54] MEANS AND APPARATUS TO MINIMIZE THE EFFECTS OF SILICON PROCESSING DEFECTS IN PROGRAMMABLE LOGIC DEVICES

[75] Inventors: Christopher F. Lane, Campbell; Srinivas T. Reddy, Santa Clara; Bonnie I. Wang, Cupertino, all of Calif.

[73] Assignee: Altera Corporation, San Jose, Calif.

[21] Appl. No.: 545,437

[22] Filed: Oct. 19, 1995

[51] Int. Cl.$^6$ .................................................. H01L 25/00
[52] U.S. Cl. ............................... 326/10; 326/41; 326/38; 365/200
[58] Field of Search ................................ 326/10, 38, 39, 326/41; 365/200

[56] References Cited

U.S. PATENT DOCUMENTS

| | | | |
|---|---|---|---|
| Re. 33,521 | 1/1991 | Mori et al. | 364/200 |
| 3,805,039 | 4/1974 | Stiffler | 235/153 AE |
| 3,995,261 | 11/1976 | Goldberg | 340/173 BB |

(List continued on next page.)

FOREIGN PATENT DOCUMENTS

| | | | |
|---|---|---|---|
| 0351983A2 | 1/1990 | European Pat. Off. | G06F 11/20 |
| 0361404A3 | 4/1990 | European Pat. Off. | G06F 11/20 |
| 0437081A2 | 7/1991 | European Pat. Off. | G06F 11/20 |
| 0596453A2 | 5/1994 | European Pat. Off. | G06F 11/20 |

OTHER PUBLICATIONS

"A Survey of Microcellular Research," R. C. Minnick, Journal of the Association of Computing Machinery, vol. 14, No. 2, pp. 203–241, Apr. 1967.

"Introducing Redundancy in Field Programmable Gate Array," F. Hatori, Proceedings of the IEEE 1993 Custom Integrated Circuits Conference held in San Diego California, 1993, pp. 7.1.1–7.1.4, May 9–12.

"Preliminary Data, Altera 32 Macrocell High Desity Max EPLD EPM 5032," 1988, Altera Corporation, Santa Clara (now San Jose), CA.

"Programmable Logic Arrays—Cheaper by the Millions," S. E. Wahlstrom, Electronics, Dec. 1967, pp. 90–95.

"Programmable Logic Devices with Spare Circuits for Use in Replacing Defective Circuits," 1988, Altera Corporation, San Jose, CA.

*Recent Developments in Switching Theory*, A. Mukhopadhyay, ed., Academic Press, New York, 1971, chapters VI and IX, pp. 229–254 and 369–422.

K. Kokkonen et al., "Redundancy Techniques for Fast Static RAMs,"Digest of Technical Papers, IEEE International Solid–State Circuits Conference, pp. 80–81, Feb., 1981.

J. Bindels et al., "Cost–Effective Yield Improvement in Fault–Tolerant VLSI Memory," Digest of Technical Papers, IEEE International Solid–State Circuits Conference, pp. 82–83, Feb., 1981.

S. Eaton et al., "A 100ns 64K Dynamic RAM Using Redundancy Techniques," Digest of Technical Papers, IEEE International Solid–State Circuits Conference, pp. 84–85, Feb., 1981.

*Primary Examiner*—Edward P. Westin
*Assistant Examiner*—Andrew Sanders
*Attorney, Agent, or Firm*—Fish & Neave; Robert R. Jackson

[57] ABSTRACT

A programmable logic array integrated circuit has several regular columns of programmable logic circuitry and a spare column which includes a subset of the programmable logic circuitry that is included in a regular column. In the event of a defect in the circuitry in a regular column that is duplicated in the spare column, the regular column logic functions that are thus duplicated are shifted from column to column so that the spare column circuitry is put to use and the defective regular column circuitry is not used. Regular column functions that are not duplicated in the spare column are not shifted. Data for programming the columns is selectively routed to the columns with or without column shifting, depending on whether that data is for functions that are or are not duplicated in the spare column.

16 Claims, 7 Drawing Sheets

U.S. PATENT DOCUMENTS

| | | | |
|---|---|---|---|
| 4,020,469 | 4/1977 | Manning | 340/172.5 |
| 4,566,102 | 1/1986 | Hefner | 371/11 |
| 4,609,986 | 9/1986 | Hartmann et al. | 364/200 |
| 4,617,479 | 10/1986 | Hartmann et al. | 326/45 |
| 4,677,318 | 6/1987 | Veenstra | 326/40 |
| 4,691,301 | 9/1987 | Anderson | 365/200 |
| 4,706,216 | 11/1987 | Carter | 365/94 |
| 4,713,792 | 12/1987 | Hartmann et al. | 364/900 |
| 4,722,084 | 1/1988 | Morton | 371/9 |
| 4,774,421 | 9/1988 | Hartmann et al. | 326/44 |
| 4,791,319 | 12/1988 | Tagami et al. | 326/13 |
| 4,798,976 | 1/1989 | Curtin et al. | 326/10 |
| 4,800,302 | 1/1989 | Marum | 326/10 |
| 4,871,930 | 10/1989 | Wong et al. | 326/39 |
| 4,899,067 | 2/1990 | So et al. | 326/38 |
| 4,912,342 | 3/1990 | Wong et al. | 326/40 |
| 5,019,736 | 5/1991 | Furtek | 326/41 |
| 5,121,006 | 6/1992 | Pedersen | 326/38 |
| 5,187,393 | 2/1993 | El Gamal et al. | 326/41 |
| 5,204,836 | 4/1993 | Reed | 365/200 |
| 5,220,214 | 6/1993 | Pedersen | 326/46 |
| 5,255,228 | 10/1993 | Hatta | 365/200 |
| 5,260,610 | 11/1993 | Pedersen et al. | 326/41 |
| 5,260,611 | 11/1993 | Cliff et al. | 326/39 |
| 5,325,334 | 6/1994 | Roh | 365/200 |
| 5,369,314 | 11/1994 | Patel et al. | 326/13 |
| 5,434,514 | 7/1995 | Cliff | 326/38 |
| 5,459,342 | 10/1995 | Nogami | 326/10 |
| 5,471,427 | 11/1995 | Murakami | 365/200 |
| 5,485,102 | 1/1996 | Cliff | 326/41 |
| 5,498,975 | 3/1996 | Cliff | 326/41 |

MEANS AND APPARATUS TO MINIMIZE THE EFFECTS OF SILICON PROCESSING DEFECTS IN PROGRAMMABLE LOGIC DEVICES

BACKGROUND OF THE INVENTION

This invention relates to programmable logic array integrated circuit devices, and more particularly to the provision and use of spare circuits for performing the functions of defective circuits in such devices.

Programmable logic array integrated circuit devices with spare circuits for performing the functions of defective circuits are well known as shown, for example, by Cliff et al. U.S. Pat. No. 5,434,514. In the arrangement shown in the Cliff et al. patent an entire column—including all the logic modules in the column, the circuits which switch logic signals into and out of those logic modules, the vertical interconnection conductors of the column and the connections between those vertical conductors and the horizontal interconnection conductors of the device, and even the connections between the vertical conductors and the input/output pins served by those vertical conductors—is functionally replaced when there is a defect anywhere in the column. This strategy works well in many cases, but there are some types of defects in a column that will cause the circuitry of that column to continue to render the device unusable even if that column is functionally replaced. For example, certain types of defects in the programmable memory cells of a column may cause input multiplexers in the column (which normally bring signals from selected horizontal interconnection conductors into the logic modules of the column) to be erroneously programmed so that two or more inputs of a multiplexer are short circuited via the output of that multiplexer. This may improperly short circuit two or more horizontal interconnection conductors to one another, thereby rendering the device unusable despite the availability of circuitry for use in replacing the defective column circuitry.

In view of the foregoing, it is an object of this invention to improve the provision and use of spare circuits in programmable logic array integrated circuit devices.

It is another object of this invention to provide programmable logic array integrated circuit devices with spare circuits that can be used to replace defective circuits on the device, and at the same time to improve control of the programming of the memory cells that determine how the replaced circuits operate to minimize adverse effects of the replaced circuits on the remainder of the device.

SUMMARY OF THE INVENTION

These and other objects of the invention are accomplished in accordance with the principles of the invention by providing programmable logic array integrated circuit devices in which one or more spare columns of logic modules are provided for use when it is necessary to replace the logic modules in a defective regular column. When there is such a defective regular column of logic modules, the logic modules from an adjacent column are used as replacement modules. This shifting of logic module functions to adjacent columns continues from column to column until a spare column of logic modules is used to perform the logic module functions that would otherwise be performed by the last regular column of logic modules. Although the functions of the various logic modules may thus be shifted from column to column, the vertical interconnection conductors of each column retain their original functions because there are no spare vertical conductors in the spare column. The same is true for the switching and/or driver circuits in each column that apply signals from the logic modules to the vertical and horizontal interconnection conductors, as well as the switching and/or driver circuits that provide connections between the vertical and horizontal interconnection conductors.

Because the programmable memory cells that control the logic modules in a column are interspersed in a series with memory cells for controlling the above-mentioned switching and/or driver circuits, the data which controls the programming of the memory cells is switched dynamically between adjacent columns in order to get the programming data for particular logic modules or drivers to the memory cells for the logic modules and drivers that are to be used. For example, if a column is not involved in any replacement of defective logic modules, programming data for all logic modules and drivers in that column may be loaded into the memory cells of that column without any re-routing of any of that data to an adjacent column. But if a column is involved in a replacement of defective logic modules, driver programming data is applied to the driver memory cells in that column, but logic module programming data is shifted to an adjacent column for storage in the logic module memory cells in that column. In conjunction with this aspect of the invention, circuits are provided in memory cell chains for selectively switching programming data around the logic module memory cells in each column. This is done by switching the programming data into the logic module memory cells in an adjacent column and then back to further memory cells in the original column. Still further circuitry is provided for selectively switching "fixed" programming data (e.g., binary zeroes) into memory cells that are not being used (either because they are in an unused spare column or because they are associated with unused circuitry in a regular column). This fixed programming data ensures that the unused circuitry is not erroneously programmed (due to a circuit defect) in such a way that it would continue to cause the device to malfunction even though the unused circuitry has been taken out of service.

Although it is assumed in the foregoing that certain types of regular column circuitry are duplicated in the spare column, while other certain types of regular column circuitry are not duplicated in the spare column, it will be understood that this is only exemplary. The types of regular column circuitry that are or are not duplicated in the spare column may differ in different applications of the invention.

Further features of the invention, its nature and various advantages will be more apparent from the accompanying drawings and the following detailed description of the preferred embodiments.

DETAILED DESCRIPTION OF THE PREFERRED EMBODIMENTS

For purposes of illustration the invention will be described in the context of programmable logic array integrated circuits of the type shown in commonly assigned, co-pending U.S. patent application Ser. No. 08/442,795, filed May 17, 1995, which is hereby incorporated by reference herein. It will be understood, however, that many details of the circuits shown in the '795 application that are not pertinent to the present invention are omitted from this discussion and the accompanying Figures to simplify the explanation of the invention and avoid obscuring the invention. For example, the '795 application shows a device having two halves that are separated by a column of random access memory ("RAM") regions. These RAM regions are not pertinent to the present invention, and so they are omitted from this discussion. Similarly, each half of the device shown in the '795 application has a spare column for use in replacing defective circuitry in a regular column in that half of the device. Thus for present purposes the two halves of device are essentially repetitive. It will therefore only be necessary to show and describe one half of the device, and that one half will simply be referred to herein as "the device". It will also not be necessary herein to differentiate between the two types of horizontal conductors (i.e., "half horizontal" and "global horizontal" conductors) that are shown in the '795 application. Instead, all such conductors shown herein will simply be referred to as "horizontal conductors."

Although the invention will thus be described in the context of a particular type of programmable logic array device architecture, it will be understood that the invention is equally applicable to many other types of programmable logic devices.

Figure 1:
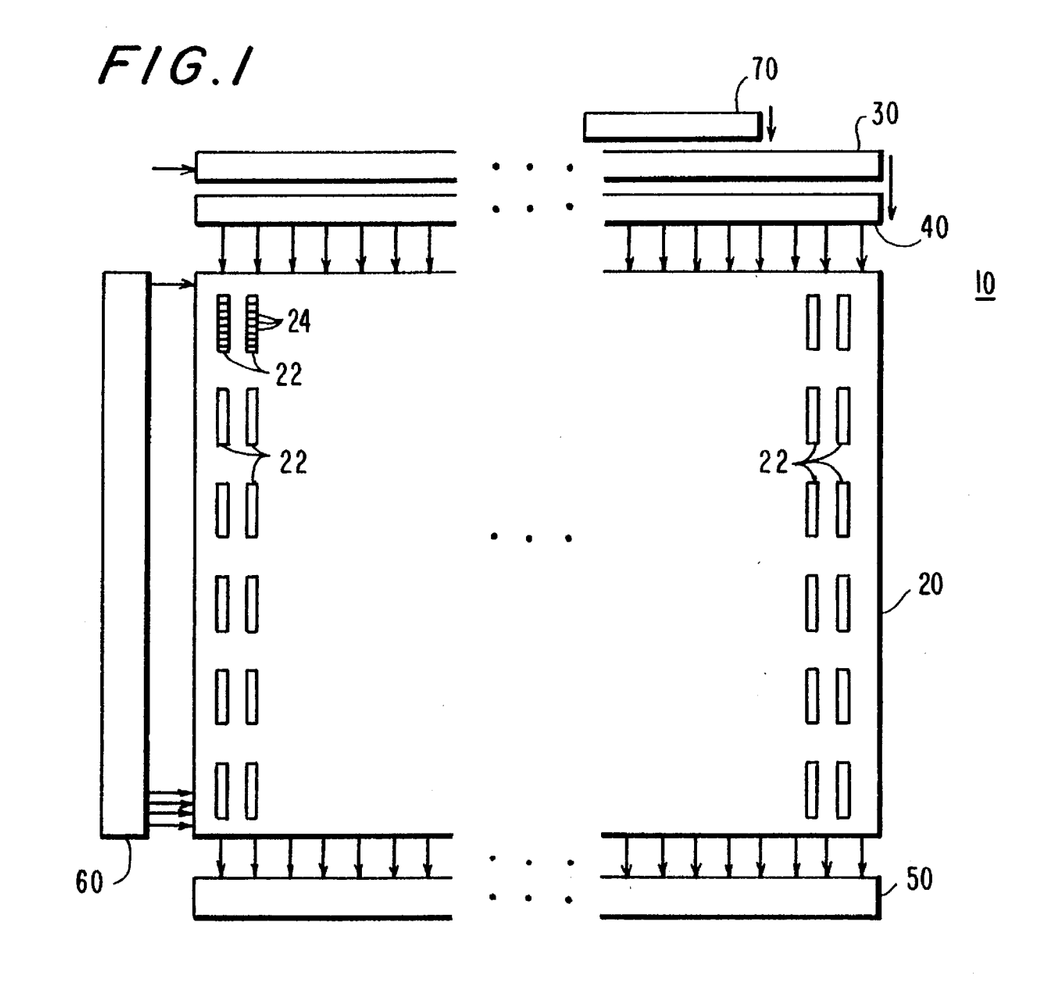
FIG. 1 is a simplified block diagram of an illustrative programmable logic array integrated circuit device which can be constructed in accordance with the principles of this invention.

As shown in FIG. 1, an illustrative programmable logic array integrated circuit 10 which can be constructed in accordance with this invention includes the following elements: (1) RAM (random access memory) array 20 in which the device performs digital logic as will be described in more detail below; (2) a first (serial) data register 30 into which data needed to program array 20 is shifted (e.g., from left to right as viewed in FIG. 1); (3) a second (parallel) data register 40 into which programming data from register 30 is shifted in parallel each time register 30 has been filled; (4) test register 50 for receiving programming data passed through all of the memory elements in array 20 from register 40 in order to test the proper functioning of the memory elements; (5) address register 60 for successively addressing horizontal rows of memory elements in array 20 to cause the addressed memory elements to store the programming data applied to them from register 40; and (6) fuse register 70 for controlling the use of the spare circuits in array 20 which are provided in case regular circuits in array 20 are found to be defective.

The logic in array 20 is subdivided into units called logic array blocks ("LABs") 22. As viewed in FIG. 1, LABs 22 are arranged in horizontal rows and vertical columns. In the depicted illustrative embodiment there are 18 columns of "regular" LABs 22 and one column (i.e., the left-most column) of "spare" LABs 22.

Each of LABs 22 is in turn subdivided into eight logic modules 24. Each logic module is capable of performing a relatively simple logic operation (e.g., providing an output signal which is any logical combination (registered or unregistered) of four input signals applied to the logic module).

Figure 2:
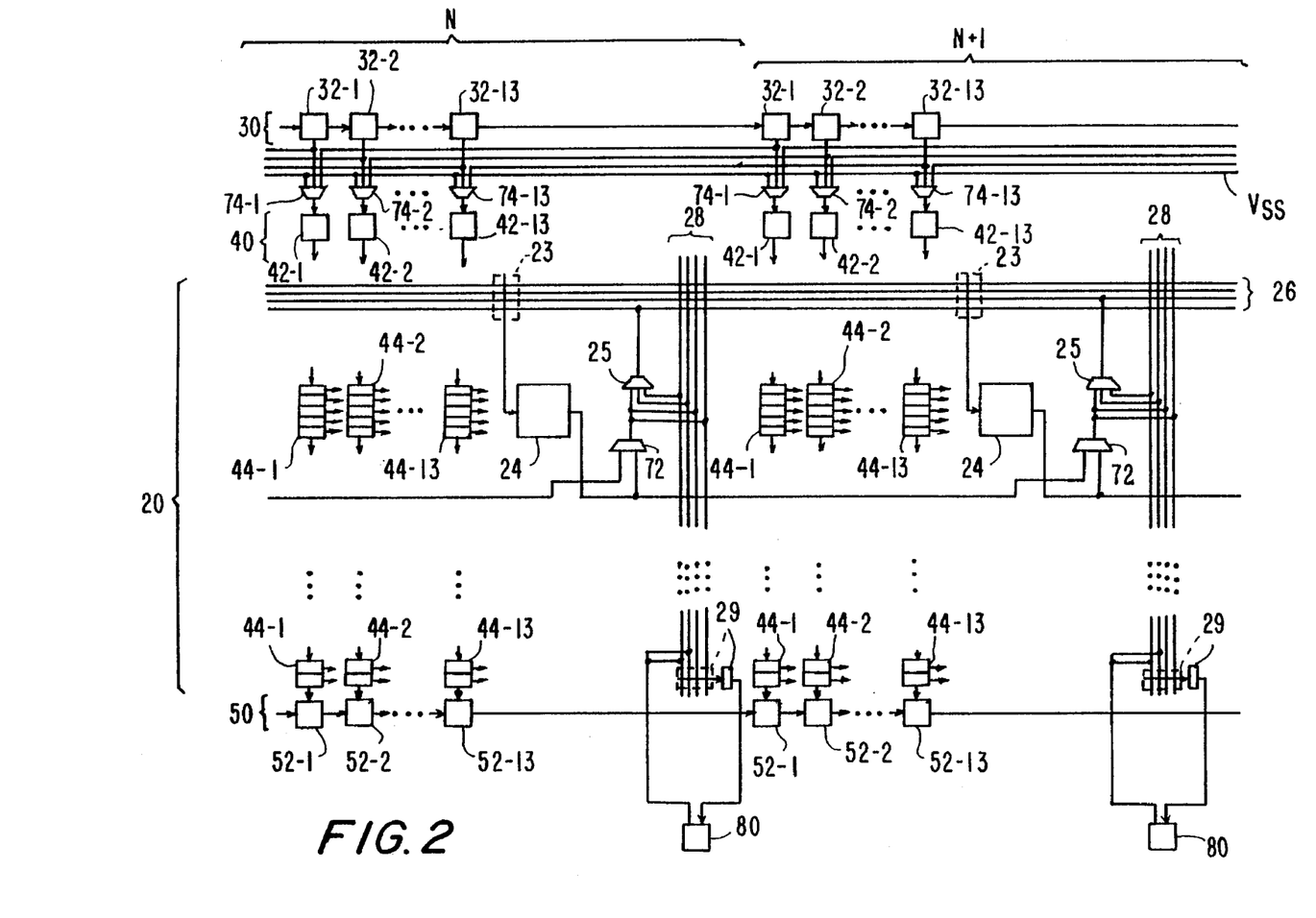
FIG. 2 is a more detailed, but still simplified schematic block diagram of representative portions of the circuit of FIG. 1

Not shown in FIG. 1, but shown in FIG. 2 and in the above-mentioned '795 application, array 20 also includes a network of conductors for interconnecting logic modules 24 in various ways so that much more complex logic functions can be performed by combining logic module output signals. (FIG. 2 shows portions of two representative regular (not spare) LAB columns N and N+1.) In particular, several horizontal interconnection conductors 26 are associated with each horizontal row of LABs 22. Similarly, several vertical interconnection conductors 28 are associated with each regular (not spare) vertical column of LABs 22. Only a few of these horizontal and vertical conductors are shown in FIG. 2 to avoid over-complicating the drawing.

Deferring for the moment situations involving shifting of logic module functions to compensate for circuit defects, the output signal of each regular column logic module 24 is selectively applied to two of the vertical conductors 28 associated with the regular LAB column which includes that logic module. (FIG. 2 is simplified by omitting switching, amplifier, or driver circuits that are typically provided in the logic module output circuits and other generally similar circuits. Some of these omitted elements may be programmable tri-state drivers or other programmably switchable components for allowing the depicted connections to be made selectively.) The output signal of each regular column logic module 24 is also selectively applied via programmable switch(es) or multiplexer(s) 25 to one or more of the horizontal conductors 26 that are associated with the LAB row which includes that logic module. (Again, switching, amplifier, and/or driver circuits that may be included in these connections are omitted from FIG. 2. In addition, although one logic-module-to-horizontal-conductor connection is shown for each logic module in FIG. 2, in a preferred embodiment two such connections are provided, one to a global horizontal conductor and one to a half horizontal conductor. As noted above, however, global horizontal and half horizontal conductors are not differentiated herein, and so the one depicted connection to a horizontal conductor will be taken as representative of the preferred two connections mentioned above.) Each multiplexer 25 can alternatively be used to connect one of several (preferably three) of the associated global vertical conductors 28 to the horizontal conductor 26 associated with that multiplexer. (Again, there are preferably two multiplexers 25 associated with each logic module 24, and so additional vertical to horizontal conductor connections can be made through the second multiplexer 25.)

Assuming that neither of columns N and N+1 is involved in any shifting of functions to make up for a circuit defect occurring in those columns or a column to the right, the depicted, representative, programmable switch or multiplexer 72 in each column is programmed to connect the output signal of the depicted logic module 24 in that column to the above-mentioned vertical and horizontal conductor connections in that column. On the other hand, if a column is involved in function shifting to compensate for a defective column, then the multiplexer 72 in each column that is thus shifting functions is programmed to connect the output of the logic module 24 in the column to the left to the above-mentioned vertical and horizontal connections associated with that multiplexer 72.

The signals on any of several of the horizontal conductors 26 associated with the row including a logic module 24 can be applied as inputs to the logic module via the associated programmable logical connection circuitry 23. As noted above, the output signal of each logic module 24 is preferably programmable to be any logical combination of these inputs. Alternative or additional inputs to each logic module may be the output of the same logic module or other logic modules in the same LAB 22. This last point is shown and described in more detail in the '795 application.

One or more input/output pins 80 are associated with each group of vertical conductors 28 for conveying data signals to or from device 10. Although all of pins 80 are shown along the bottom of the device, it will be understood that additional pins 80 may be similarly connected along the top of the device. Still other input/output pins (not shown) may be similarly connected adjacent each end of each group of horizontal conductors 26. Programmable logic connector circuitry 29 is provided for selectively connecting any of several of the vertical conductors 28 associated with each input/output pin 80 to that pin. Alternatively, each input/output pin 80 is selectively connectable for data input purposes to one or more of several of the vertical conductors associated with that pin 80 via the depicted input connections (which preferably include tri-state drivers or other programmably switchable elements (not shown)).

The spare column of logic modules 24, which is located to the left of all the regular columns, is similar to a regular column except that it does not have any vertical conductors 28 or input/output pins 80. It does have the usual logic modules 24 and associated programmable connections 23 from horizontal conductors 26. But when the spare column is used to perform logic that would otherwise be performed by the regular column to the right, its logic module outputs are switched back to the column to the right via the multiplexer 72 in that column. Thus the spare column drives into the horizontal and vertical conductor connections of the regular column to the right. Vertical to horizontal conductor connections in the column to the right of the spare column also continue to be used. The spare column can therefore compensate for defects in components 23 and 24 in a regular column (or in the programming data memory cells that control components 24), but it cannot compensate for other types of defects in the device (e.g., a defective vertical conductor, or a defective vertical to horizontal conductor connection). Nevertheless, components 23 and 24 and associated programming data memory cells constitute a large portion of the resources of device 10, and so providing a spare column of such resources makes it possible to repair many devices that would otherwise have to be scrapped because of defects.

Turning now to the circuitry for programming device 10, programming data is fed into shift register 30 from left to right until that register is filled. When register 30 is full, the contents of that register are shifted in parallel from register 30 to register 40. If none of the regular columns of logic modules 24 contains a defect, then programmable logic connectors (e.g., multiplexers) 74 in FIG. 2 are controlled to transfer data straight down from register 30 to register 40. In this way the data entered into register 30 for each column of logic modules remains associated with that same column after the transfer to register 40. (Programmable logic connectors 74 are controlled by fuse register 70, which may have a fuse that is burned out or not for each logic module column to indicate whether or not that column is involved in a shifting of functions because of a defect in the device.)

On the other hand, if there is a repairable defect in the device, then some of the programming data for the column containing the defect and all of the columns to the left of that column is shifted to the left one column during the transfer from register 30 to register 40. The data that is thus shifted left one column is the data that programs the circuitry (e.g., 23) that feeds each logic module 24 and the data that programs the logic modules themselves. Even if the input multiplexer and logic module programming data for a column is thus shifted left one column, the programming data for controlling (1) input/output connections to the pins 80 associated with that column, (2) connections from the logic module outputs in that column to the associated horizontal and vertical conductors 26 and 28, and (3) the connections between the horizontal and vertical conductors associated with that column are not shifted. This is because the spare column includes only spare components 23 and 24, but no spare vertical conductors, no spare connections from the spare logic module outputs to horizontal or vertical conductors, and no spare connections between horizontal and vertical conductors. Thus, when logic functions are shifted left one column to compensate for circuit defects, the logic module outputs that are involved in the shift must be shifted back to the right (via multiplexers 72) in order to use the originally intended connections into the horizontal and/or vertical conductors.

Continuing with the discussion at the level of detail shown in FIGS. 1 and 2, as soon as programming data has been shifted from register 30 to register 40, the process of shifting more data into register 30 can begin. At the same time, the data in register 40 flows down through columns of programming data memory cells 44 (referred to for convenience as RAM cells 44). Each column of RAM cells 44 receives data from a respective one of the stages of register 40. Initially the data may flow all the way to the bottom of RAM cell columns 44 and into shift register 50. The data thus received by register 50 can be shifted out (e.g., from left to right) in order to verify that all of RAM cells 44 are transmitting data properly. Thereafter, register 60 is gradually filled from the bottom to the top with control data that effectively disconnects each RAM cell 44 that has received its intended data from the RAM cell 44 immediately above that RAM cell so that subsequent data from register 40 will not disturb or alter the data stored in the most recently cut off RAM cell. In other words, control data that cuts off the RAM cells 44 in all of the RAM cell columns shifts up in register 60 at the same rate that register 40 is supplying programming data to the RAM cells.

Although FIG. 2 shows 13 columns of RAM cells associated with each column of logic modules 24, it will be understood that there can be any number of RAM cells associated with each logic module column.

Figure 3:
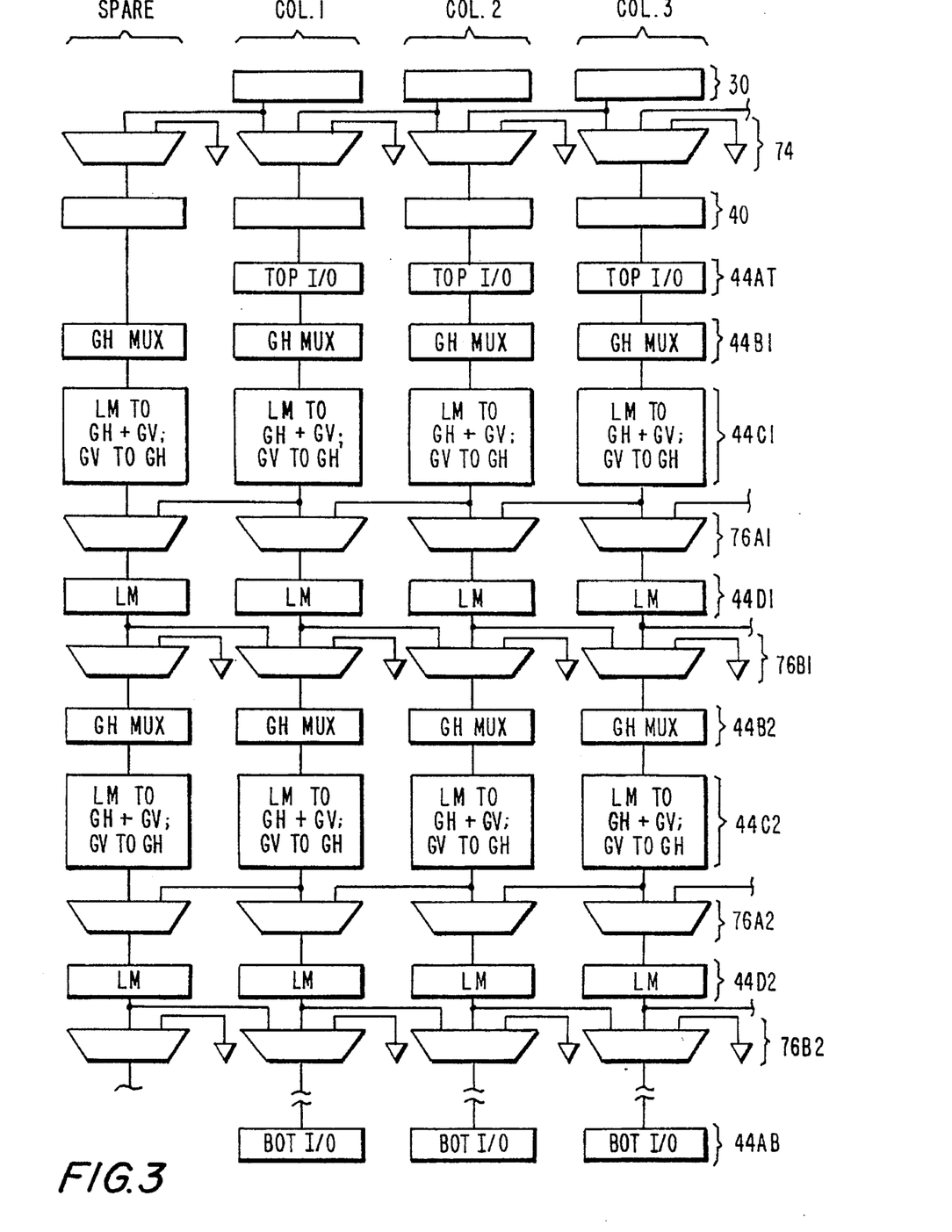
FIG. 3 is a simplified schematic block diagram of other aspects of representative portions of the circuit of FIG. 1 in accordance with this invention.

In each column of RAM cells 44 some of the cells control the programming of the input/output circuitry associated with input/output pins 80. In the illustrative organization of RAM cells 44 shown in FIG. 3 these are the RAM cells in the rows referenced 44AT and 44AB (where the suffix A denotes a RAM cell category A for input/output circuitry control, the suffix T refers to the input/output circuitry for the top input/output pins 80, and the suffix B refers to the input/output circuitry for the bottom input/output pins 80). (The spare column shown on the left in FIG. 3 has no RAM cells 44AT or 44AB because (as described above) the spare column has no input/output pins 80 of its own.) Other RAM cells 44 in each column control the programming of logic array block input multiplexers 23. In FIG. 3 these are the RAM cells in the rows referenced 44B1, 44B2, etc. (where the suffix B denotes a RAM cell category B for logic array block input multiplexer control, and the suffix 1, 2, etc. identifies the associated horizontal row of logic in device 10; "GH" in FIG. 3 refers to horizontal conductors 26). Still other RAM cells 44 in each column control the programming of the circuitry that applies the logic module output signals to conductors 26 and 28 and the interconnections between those conductors. In FIG. 3 these are the RAM cells in the rows referenced 44C1, 44C2, etc. (where the suffix C denotes a RAM cell category C for this type of control circuitry, and the suffix 1, 2, etc. identifies the associated row of logic in device 10; "LM" and "GV" in FIG. 3 refer respectively to logic modules 24 and vertical conductors 28). (The spare column (on the left in FIG. 3) is shown with RAM cells 44C only because providing such cells in the spare column may simplify layout of the device. However, RAM cells 44C in the spare column perform no actual function and could be omitted if desired.) The final groups of RAM cells 44 in each column control the programming of logic modules 24 themselves, which may include additional multiplexers between the outputs of programmable logic connector circuitry 23 and the inputs to the logic modules. In FIG. 3 these are the RAM cells in the rows referenced 44D1, 44D2, etc. (where the suffix D denotes a category D for logic module control, and the suffix 1, 2, etc. identifies the associated row of logic in device 10).

FIG. 3 shows representative portions of four adjacent columns of RAM cells 44 on device 10. In particular, FIG. 3 shows a portion of a spare column and portions of regular columns 1, 2, and 3. (It will be understood that there may be other types of columns of RAM cells on device 10 that are not shown in any of the Figures herein because they are not pertinent to this invention. For example, there may be other columns of RAM cells that program input/output circuitry associated with input/output pins at the ends of the horizontal conductors 26.)

FIG. 3 additionally shows that there are switching circuits 76 (e.g., multiplexers) at strategic locations along each column of RAM cells 44. As will be described below, these switching circuits (like switching circuits 74) are used to selectively switch programming data from one column to an adjacent column and back again (depending on the type of programming data that it is) in order to get that programming data to the correct destination and possibly also to route that programming data around nonfunctioning portions of a RAM cell column. In addition, these switching circuits 74 and 76 may be used to switch fixed programming data (e.g., all zeroes) into RAM cells 44 that are otherwise not being used because a fault in device 10 has caused their functions to be switched away from them.

As has been mentioned, there are two principal kinds of defects in device 10 that the circuitry shown in FIGS. 1–3 can compensate for. These are (1) a defect in any one column in the circuitry controlled by RAM cells of types 44B and 44D, and (2) a defect in any one column of RAM cells of type 44D. These defects are dealt with by selectively routing programming data away from the RAM cells 44 that are associated with the possibly defective circuitry. In addition, programming data is routed around possibly defective RAM cell groups 44D. This will now be explained in more detail with reference to FIGS. 4 and 5.

Figure 4:
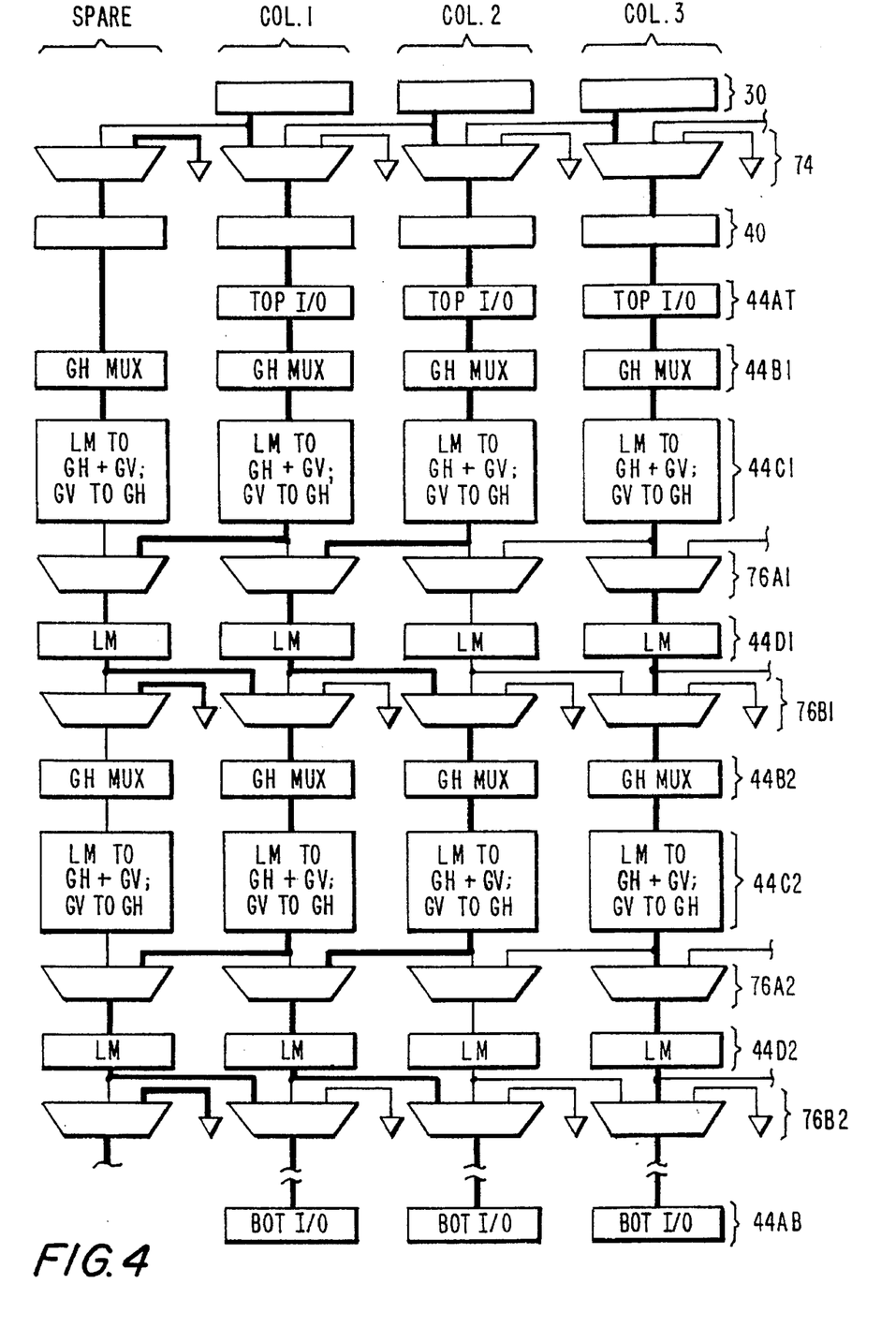
FIG. 4 is similar to FIG. 3 but shows the use of particular programming data flow paths in the depicted circuitry.
Figure 5:
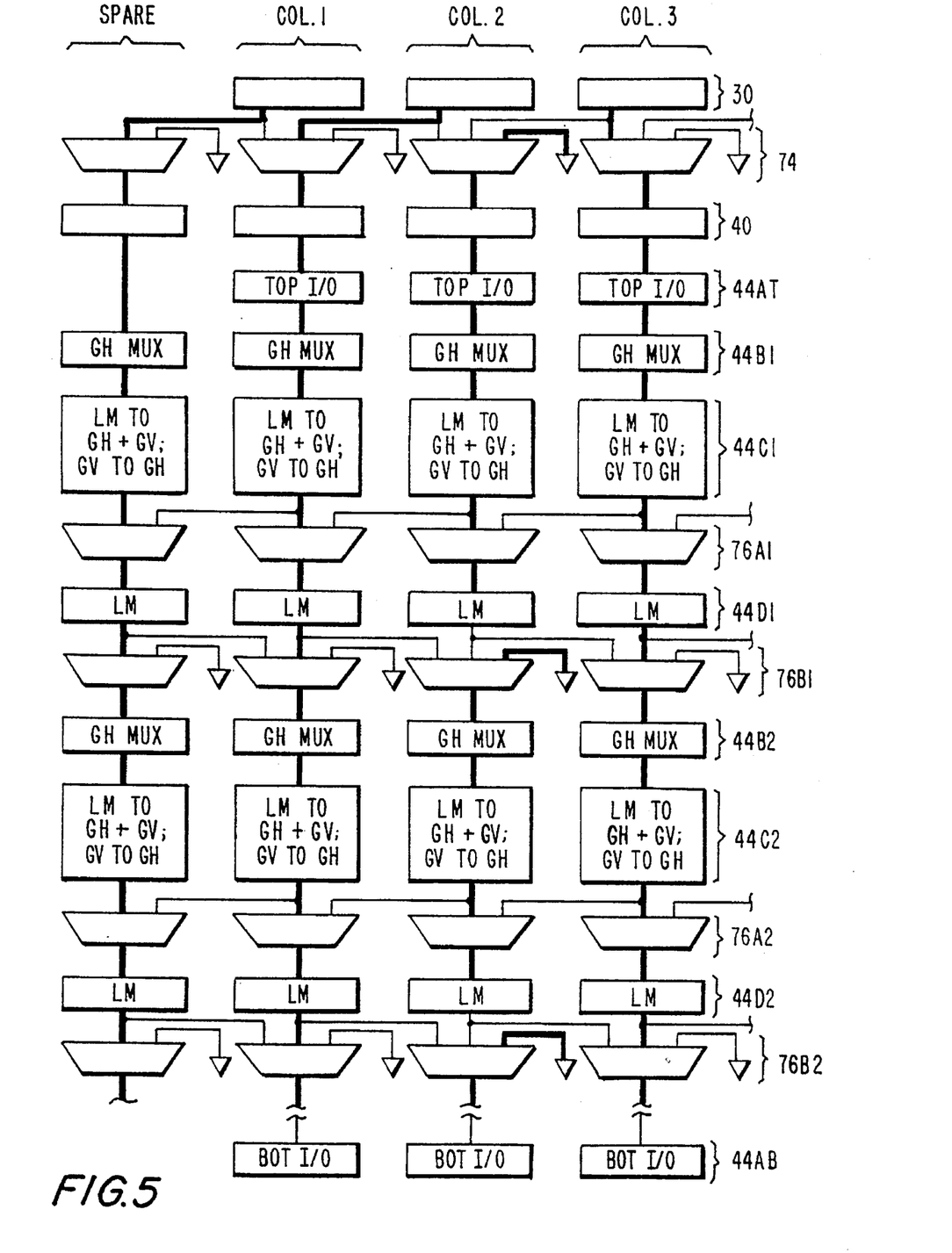
FIG. 5 is again similar to FIG. 3 but shows the use of other programming data flow paths in the depicted circuitry.

FIGS. 4 and 5 are both similar to FIG. 3, except that FIGS. 4 and 5 show by heavy lines the programming data flow paths that are actually used at various times during the programming of device 10. FIGS. 4 and 5 both assume the same fault condition, namely, a defect in column 2. This defect can be either in the circuitry controlled by one or more of the column 2 RAM cell groups 44B and 44D, or in one or more of the column 2 RAM cell groups 44D per se.

Figure 6:
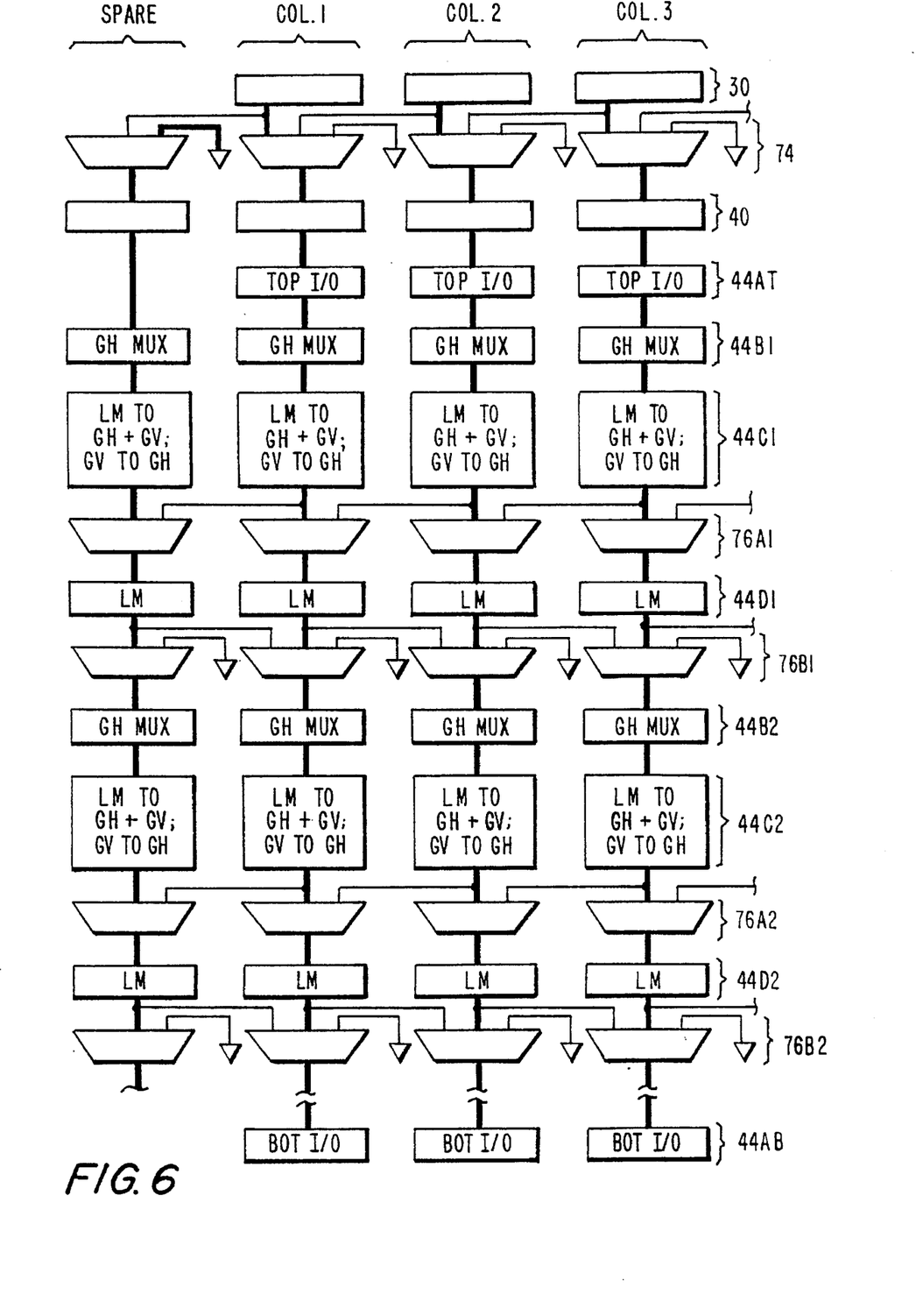
FIG. 6 is once again similar to FIG. 3 but shows the use of still other programming data flow paths in the depicted circuitry.

In order to circumvent the assumed defect in regular column 2, switching circuits 74 and 76 are controlled to cause programming data to flow along the heavy line paths shown in FIG. 4 when the programming data is data of the kind that is destined for category 44A and category 44C RAM cells. Considering first the spare column, use of the circuit paths shown by heavy lines in FIG. 4 causes the multiplexers 74 and 76B in the spare column to apply data from a fixed data source (shown as ground, VSS, or logic 0) to the RAM cells 44 below these multiplexers in the spare column. This fixed programming data flows down through these spare column RAM cells as far as the next multiplexer 76A or as far as is permitted by the current state of register 60. This use of fixed programming data is not particularly important in the case where (as in FIGS. 4 and 5) the spare column is going to be used, but a somewhat similar principle is used to load the spare column RAM cells 44 with zeroes when the spare column is not going to be used. This is discussed in more detail below in connection with FIG. 6, which shows the flow of programming data when the spare column is not being used.

Continuing with the discussion of FIG. 4, in each of columns 1 and 2 multiplexers 74 are controlled to transfer programming data for RAM cell categories 44A and 44C from the column 1 and 2 portions of register 30 to the respective column 1 and 2 portions of register 40. In addition, in these two columns and in the spare column multiplexers 76A are controlled to shift the programming data to the left by one column, and the subsequent multiplexers 76B are controlled to shift the programming data back to the right one column. This causes the programming data in column 1, for example, to flow down through column 1 RAM registers 44AT, 44B1, and 44C1, but to then shift left to the spare column where it continues to flow down through spare column RAM cells 44D1. Below spare column RAM cells 44D1 this programming data shifts back to its original column 1 and continues to flow down through column 1 RAM cells 44B2 and 44C2. After column 1 RAM cells 44C2 the programming data shifts left one column again and continues to flow down through spare column RAM cells 44D2. Then the programming data shifts back to its original column 1 and continues to flow down in a continuation of the pattern that has just been described. At the bottom of column 1 this pattern ends with the data flowing to bottom I/O RAM cells 44AB. It will thus be seen that the column 1 programming data for RAM cell register categories 44A and 44C (for which there is no spare circuitry in the spare column) flows down through all the RAM cells of column 1, except for the 44D RAM cell category where the programming data is temporarily shifted left one column. The same is true for the corresponding column 2 programming data. This allows this programming data to reach the 44A and 44C category RAM cells in columns 1 and 2, while allowing this data to bypass the possible defect in the category 44D RAM cells in column 2.

With regard to column 3, which is not involved in any shifting of logic functions to compensate for the assumed defect in column 2, all programming data flows straight down from the column 3 portion of register 30 to the column 3 portion of register 40 and all of the column 3 RAM cells 44. The same is true for all columns to the right of column 3, which are also not involved in any logic function shifting. Of course, as has been explained, any particular programming data only flows down through each RAM cell column as far as is currently permitted by register 60, and register 60 is controlled so that the RAM cell columns fill with stored data from the bottoms of the columns to their tops. In other words, the first programming data supplied goes all the way to the bottoms of the columns, where it is stored. The next programming data flows down only to the RAM cells 44 above the bottom-most cells and is stored in those cells. This process of filling the columns from the bottom up continues until all the RAM cells have received and are storing their data. In the case of the assumed defect in column 2, some of this data will flow along heavy line paths shown in FIG. 5, as will now be discussed.

When the programming data in register 30 is of the type intended for category 44B or category 44D RAM cells, then the programming data flow pattern shown in heavy lines in FIG. 5 is used. In this pattern the multiplexers 74 in the spare column are controlled so that the programming data in the column 1 portion of register 30 is transferred to the spare column portion of register 40. From there the programming data flows down through all the spare column RAM cells 44 (or as many of those RAM cells as the current state of register 60 permits). In column 1 multiplexers 74 are controlled so that the programming data from the column 2 portion of register 30 is transferred to the column 1 portion of register 40. From there this programming data flows down through all the column 1 RAM cells 44 (to the extent permitted by register 60). In column 2 each of multiplexers 74 and 76B is controlled to pass fixed data (assumed to be logic 0) to all the column 2 RAM cells 44 below those multiplexers. Column 3 is the first column that is not involved in any shifting of logic functions, and so it continues to receive programming data from the column 3 portion of register 30 as described above in connection with FIG. 4. The same is true for all columns to the right of column 3.

The effect of the programming data flow pattern shown in FIG. 5 is to route the category 44B and 44D RAM cell data that would normally go to column 1 to the spare column instead, and to route the corresponding programming data that would normally go to column 2 to column 1 instead. In addition, the connections to fixed programming data sources that are used in column 2 cause the category 44B RAM cells in column 2 to store all zeroes. This prevents spurious non-zero programming data that may have originated from a defect in a category 44D RAM cell higher up in column 2 from causing short circuits in unused column 2 programmable logic connection regions 23. Such a short circuit may result, for example, from this spurious programming data causing two horizontal conductors 26 that feed a multiplexer in a region 23 to be connected to the output of that multiplexer. By programming the column 2 GH multiplexer control RAM cells 44B with all zeroes, none of the column 2 connector region 23 inputs are connected to outputs of those regions, and so no short circuits can occur in those regions.

From the foregoing it will be appreciated that as the programming of device 10 proceeds, the programming data flow will periodically switch back and forth between the pattern shown in FIG. 4 and the pattern shown in FIG. 5. For example, at the beginning of the programming process the FIG. 4 pattern will be used until RAM cells 44AB are filled. Then the pattern shown in FIG. 5 will be used until RAM cells 44Dn are filled (where n is the number of the bottom-most row of logic modules). Next, the pattern shown in FIG. 4 is used again until RAM cells 44Cn are filled. Then the FIG. 5 pattern is used again to fill RAM cells 44Bn. This process of alternately using the FIG. 4 and FIG. 5 programming data flow patterns continues until at the end of the programming process RAM cells 44AT are filled using the FIG. 4 pattern.

As mentioned above, FIG. 6 shows (with heavy lines) the programming data flow pattern when device 10 is defect-free and there is therefore no need to use the spare column. In this case multiplexers 74 in the spare column are controlled to connect the fixed data source (logic 0) to the spare column portion of register 40. This causes fixed data to flow down through all of spare column RAM cells 44. The consequent filling of spare column RAM cells 44B with zeroes prevents short circuits in spare column connection regions 23 (as was described above in connection with FIG. 5 and the storage of zeroes in column 2 RAM cells 44B). In all of the other columns multiplexers 74 are controlled to transfer programming data from the associated portion of register 30 to the associated portion of register 40. This causes programming data to flow straight down from register 30 to register 40 and then to the RAM cells in each column.

Figure 7:
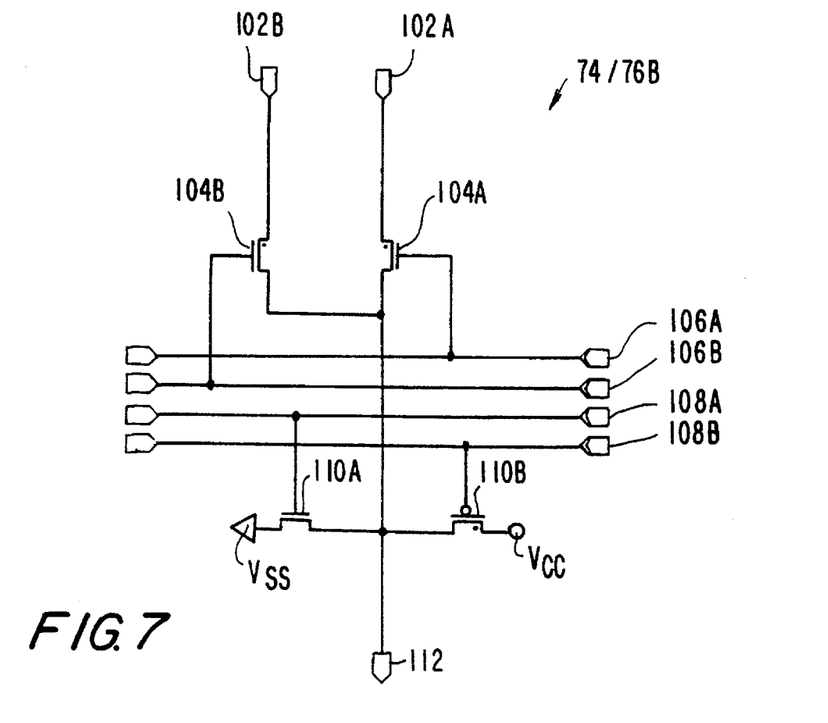
FIG. 7 is a more detailed schematic diagram of an illustrative embodiment of certain components that are employed in the preceding FIGS.

FIG. 7 shows an illustrative embodiment of a switching circuit or multiplexer of the type that can be used for components 74 and 76B. The two inputs 102A and 102B at the top of FIG. 7 are the two real programming data inputs. (In certain special cases (i.e., in the spare column) components 74 and 76B have only one real programming data input. In that event the appropriate one of the two inputs 102 in FIG. 7 can be omitted.) To pass the data applied to input 102A to data output 112 transistor 104A is enabled by an appropriate signal on rail 106A. On the other hand, to pass the data applied to input 102B to output 112 transistor 104B is enabled by an appropriate signal on rail 106B. If "fixed" programming data is to be applied to output 112, then neither of transistors 104 is enabled. Instead, one or the other of transistors 110 is enabled by an appropriate signal on one of rails 108. For example, if logic 0 is to be applied to output 112, then transistor 110A is enabled to connect output 112 to VSS. Alternatively, if logic 1 is to be applied to output 112, then transistor 110B is enabled to connect VCC to output 112.

The columns of RAM cells 44 may be implemented by means of serially connected inverting RAM cells. In such inverting RAM cells the data stored and output by the cell is the inverse of the data input to the cell. This means that, in order to store logic 0 zero in a particular RAM cell, it may be necessary to apply either logic 1 or logic 0 to the series of RAM cells that leads to that RAM cell, depending on the number of RAM cells that there are in the series between the point at which the logic 1 or logic 0 is applied and the target RAM cell. For example, if the RAM cells are numbered from 0 beginning immediately after the point of application of the logic 1 or logic 0 and ending with the target RAM cell, then logic 1 will have to be applied to store logic 0 in even-numbered target RAM cells, and logic 0 will have to be applied to store logic 0 in odd-numbered target RAM cells. With regard to embodiments of this kind, FIGS. 2–6 are simplified to the extent that they refer only to VSS as the fixed programming data source. In fact, VCC and VSS will have to be used as the fixed programming data source during alternate programming data intervals. This can be accomplished using switching circuitry of the type shown in FIG. 7 by alternately enabling transistors 110A and 110B during successive programming data intervals in which fixed programming data is to be stored. (It will be understood that the same principles apply to the transmission of real programming data through serially connected inverting RAM cells. If it is desired to store logic 1 in a target RAM cell that has an even number determined as described above, then the programming data must be logic 0. Or in that case, if the target RAM cell is to store logic 1, the real programming data must be logic 0. If the target RAM cell has an odd number, then the real programming data has the same value as the data that will be stored.)

Figure 8:
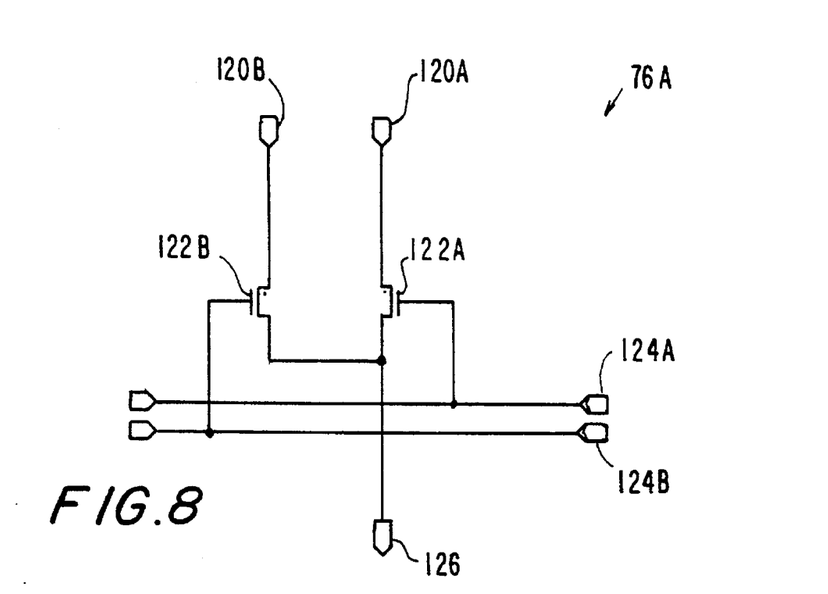
FIG. 8 is a more detailed schematic diagram of an illustrative embodiment of certain other components that are employed in earlier FIGS.

FIG. 8 shows an illustrative embodiment of a switching circuit of the type used at 76A in FIGS. 3–6.

The two programming data inputs 120A and 120B are shown at the top in FIG. 8. If the programming data applied to input 120A is to be passed to data output 126, then transistor 122A is enabled by an appropriate signal on rail 124A. On the other hand, if the programming data applied to input 120B is to be passed to data output 126, then transistor 122B is enabled by an appropriate signal applied to rail 124B.

The signals applied to rails 106, 108, and 124 in FIGS. 7 and 8 can be generated by logically combining the output signals of fuse register 70 (which indicate whether or not each column is involved in function shifting) and the output signals of register 60 (which indicate how far the programming of the columns of RAM cells 44 has progressed).

It will be understood that the foregoing is only illustrative of the principles of the invention, and that various modifications can be made by those skilled in the art without departing from the scope and spirit of the invention. For example, particular functions have been illustrated as having spare counterparts in the spare column, while other particular functions have no spare column counterparts. This leads to shifting certain programming data from column to column when the spare column is to be used, while other programming data for the same column(s) is not shifted. However, if different functions are provided with spares in the spare column, then different programming data may have to be shifted from column to column than has been illustratively described herein. It will also be understood that words like "column" and "row" are used herein arbitrarily, and that these words should be considered interchangeable. The same is true for words like "horizontal" and "vertical", "up" and "down", "top" and "bottom", "left" and "right", etc. In other words, the invention is not limited to any particular orientation of the programmable logic array integrated circuit. As still another example of modifications within the scope of the invention, the particular device architecture shown in FIG. 2 is only illustrative, and it will be understood that the invention is equally applicable to many other device architectures.

The invention claimed is:

1. Programmable logic array integrated circuit device apparatus comprising:

a plurality of regular columns of programmable programming data memory cells disposed substantially side by side on said device, the cells in each of said columns being connected to one another in a series such that programming data applied at any point in said series flows from that point down the series in a direction from a top of said column toward a bottom of said column, adjacent cells in the series in each of said columns being grouped into a plurality of first groups and a plurality of second groups which are interspersed with said first groups in said series;

a spare column of programmable programming data memory cells disposed substantially side by side with one of said regular columns which is at an end of said plurality of said regular columns, the cells in said spare column being connected to one another in a series such that programming data applied at any point in said series flows from that point down the series in a direction from a top of said spare column toward a bottom of said spare column, adjacent cells in the series in said spare column being grouped into a plurality of second groups, each of which is associated with a respective one of the second groups in each of said regular columns;

first switching circuitry disposed in the series in each of said columns in advance of each of said second groups in said column for selectively connecting (1) any cell in said column which is immediately above said first switching circuitry to any cell in said column which is immediately below said first switching circuitry or (2) any cell in a first column adjacent to said column in a direction away from said spare column, which cell is immediately above the first switching circuitry in said first adjacent column, to any cell in said column which is immediately below said first switching circuitry; and second switching circuitry disposed in the series in each of said columns below each of said second groups in said column for selectively connecting (1) any cell in said column which is immediately above said second switching circuitry to any cell in said column which is immediately below said second switching circuitry or (2) any cell in a second column adjacent to said column in a direction toward said spare column, which cell is immediately above the second switching circuitry in said second adjacent column, to any cell in said column which is immediately below said second switching circuitry.

2. The apparatus defined in claim 1 further comprising:

a programming data input terminal associated with each of said regular columns; and third switching circuitry associated with each of said columns for selectively connecting (1) the input terminal associated with said column to a first cell in the series of cells in said column or (2) the input terminal associated with said first adjacent column to said first cell in said series.

3. The apparatus defined in claim 2 further comprising:

a source of fixed programming data, and wherein said third switching circuitry associated with each of said columns can alternatively selectively connect said source to said first cell in the series of cells in said column.

4. The apparatus defined in claim 3 wherein said second switching circuitry associated with each of said columns can alternatively selectively connect said source to said cell which is immediately below said second switching circuitry.

5. The apparatus defined in claim 1 wherein each of said regular columns further comprises:

a plurality of first regions of programmable logic functionality of a first type, each of said first regions being controlled by programming data stored in the cells in a respective one of said first groups in said column; and a plurality of second regions of programmable logic functionality of a second type, each of said second regions being controlled by programming data stored in the cells in a respective one of said second groups in said column; and wherein said spare column further comprises:

a plurality of second regions of programmable logic functionality of said second type, each of said second regions in said spare column being controlled by programming data stored in the cells in a respective one of said second groups in said spare column.

6. The apparatus defined in claim 5 wherein each of said second regions comprises:

a plurality of logic modules, each of which receives a plurality of logic module input signals and produces a logic module output signal which is a programmable logical combination of said input signals.

7. The apparatus defined in claim 5 wherein each of said first regions comprises:

a plurality of programmable connections for selectively connecting logic module output signals to interconnection conductors which convey signals between logic modules.

8. The apparatus defined in claim 7 wherein each of said first regions further comprises:

a plurality of programmable interconnections for selectively making connections between interconnection conductors.

9. The apparatus defined in claim 8 wherein said interconnection conductors include:

a plurality of vertical conductors associated with each of said regular columns for conveying signals substantially parallel to the associated column.

10. The apparatus defined in claim 9 wherein, in addition to being included in each of said columns, said logic modules are disposed on said device in a plurality of substantially parallel rows that substantially perpendicularly intersect said columns, and wherein said interconnection conductors further include:

a plurality of horizontal conductors associated with each of said rows for conveying signals substantially parallel to the associated row.

11. The apparatus defined in claim 10 wherein said programmable connections of each first region in each regular column selectively connect logic module output signals to vertical conductors associated with that column, and further selectively connect logic module output signals to horizontal conductors associated with the logic modules producing those output signals.

12. The apparatus defined in claim 11 wherein each of said programmable interconnections selectively makes a connection between a horizontal conductor and a vertical conductor.

13. The apparatus defined in claim 12 further comprising:

logic module output signal switching circuitry associated with each of said logic modules in each of said regular columns for selectively applying either the logic module output signal of the associated logic module or the logic module output signal of a logic module in said second adjacent column to said programmable connections of said regular column.

14. The apparatus defined in claim 13 further comprising:

a plurality of programmable logic module input signal selection circuits associated with each of said logic modules for selectively applying signals on horizontal conductors associated with the row that includes said logic module to said logic module as the logic module input signals of said logic module.

15. The apparatus defined in claim 3 wherein each said source of fixed programming data comprises:

a logic zero signal originator circuit;

a logic one signal originator circuit; and switching circuitry for selecting either the signal originated by said logic zero signal originator circuit or the signal originated by said logic one signal originator circuit as said fixed programming data.

16. The apparatus defined in claim 4 wherein each said source of fixed programming data comprises:

a logic zero signal originator circuit;

a logic one signal originator circuit; and switching circuitry for selecting either the signal originated by said logic zero signal originator circuit or the signal originated by said logic one signal originator circuit as said fixed programming data.

\* \* \* \* \*